United States Patent [19]
Mizusawa

[11] 3,874,766
[45] Apr. 1, 1975

[54] DEVICE FOR REMOVABLY HOLDING A PLATE, SUCH AS A PRINTED CIRCUIT BOARD

[75] Inventor: Akira Mizusawa, Kanagawa, Japan

[73] Assignee: Nifco Inc., Tokyo, Japan

[22] Filed: Apr. 10, 1974

[21] Appl. No.: 459,503

[30] Foreign Application Priority Data

June 16, 1973 Japan ................................ 48-70689

[52] U.S. Cl. ............ 339/125 R, 211/26, 339/119 A
[51] Int. Cl. ............................................ H02b 1/04
[58] Field of Search ........ 339/17 C, 17 M, 176 MP, 339/125 R, 119 R, 75 MP, 126 R; 211/26; 248/223

[56] References Cited

UNITED STATES PATENTS 2,708,088 5/1955 Steinke ................................ 248/223
3,066,367 12/1962 Garman ........................ 339/17 M X
3,705,377 12/1972 Hansen et al. ..................... 211/26 X
3,719,917 3/1973 Fischer et al. .............. 339/125 R X

FOREIGN PATENTS OR APPLICATIONS 6,409,207 2/1966 Netherlands ...................... 339/17 C

*Primary Examiner*—Roy Lake
*Assistant Examiner*—E. F. Desmond
*Attorney, Agent, or Firm*—Robert W. Beart; J. R. Halvorsen

[57] ABSTRACT

Disclosed is a device for removably holding and mounting a plate such as a printed circuit board, to a base board. The plate is held above the base board, and therefore if the plate has something projecting from the back thereof, it will be accommodated in the space between the back of the plate and the upper surface of the base board, and the base board having a plate attached by means of a holder according to this invention can be put on other plates or any flat surface.

2 Claims, 3 Drawing Figures

DEVICE FOR REMOVABLY HOLDING A PLATE, SUCH AS A PRINTED CIRCUIT BOARD

DETAILED EXPLANATION OF THE INVENTION

This invention relates to a device for removably holding a plate such as a printed circuit board to a base board or frame in an electric apparatus or in the electric system of an automobile.

In an attempt to meet ever increasing need to save labor and simplify the work of fixing printed circuit boards, numerous synthetic resin holders have hitherto been proposed. In almost all the holders there is provided an anchor means in the form of an anchor or bulge, and such anchor means is yieldably deformed when it is inserted in an associated female aperture of a base board. After insertion in the female aperture, the anchor means returns to its original form, thus anchoring the holder to the base board. In this connection it is necessary that the base board to which the holders for printed circuit boards are anchored, has extra space on the side opposite that on which the plate is to be held to allow the anchor means to partially project from the back surface thereof.

One object of this invention is to provide such a holder which requires no extra space to the rear.

Another object of this invention is to provide such a holder which permits the printed circuit board to be easily fixed and removed as required.

To attain these objects according to this invention there is provide a synthetic resin device for removably holding a plate such as a printed circuit board comprising a main block body having a front, a back and two opposite sides; a support projection integrally connected to the lower part of the front of said main block body; a ramp catch the thin end of which is integrally connected to the upper part of the front of said main block and the thick end of which extends to just above said support projection, leaving therebetween a space as large as the thickness of said plate; and two or more staggered projections rising from each of the two opposite sides of said main block body and spaced apart from each other by a distance equal to the thickness of associated rising tab plates, the back of said main block body having a recess to accommodate said ramp catch when it is pushed and yieldingly sunk.

This invention will be better understood from the following description of a preferred embodiment with reference to the accompanying drawings in which: FIG. 1 is a perspective view showing a plate such as a printed circuit board, a holder device and a base board.

Figure 1:
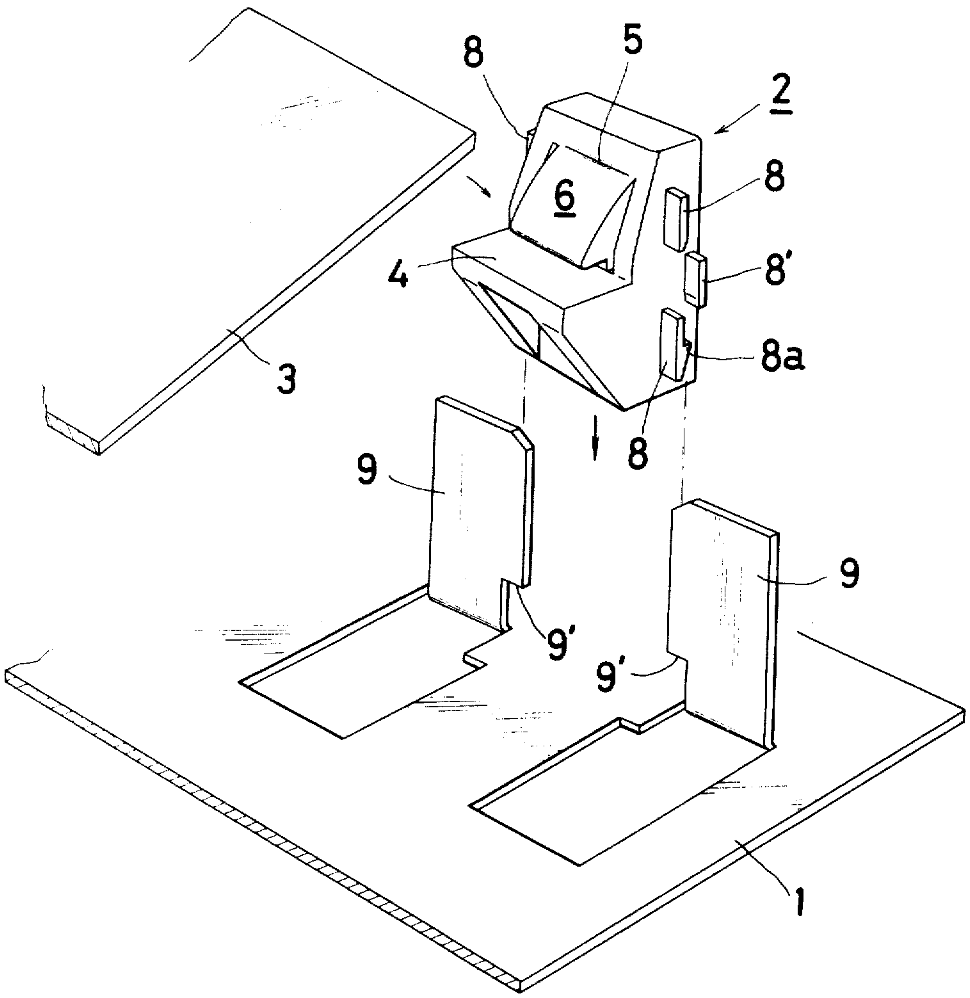
Figure 2:
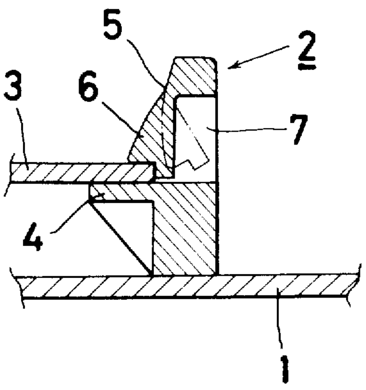
FIG. 2 is a side view of the holder, showing, in section, the manner in which the holder device is used.
Figure 3:
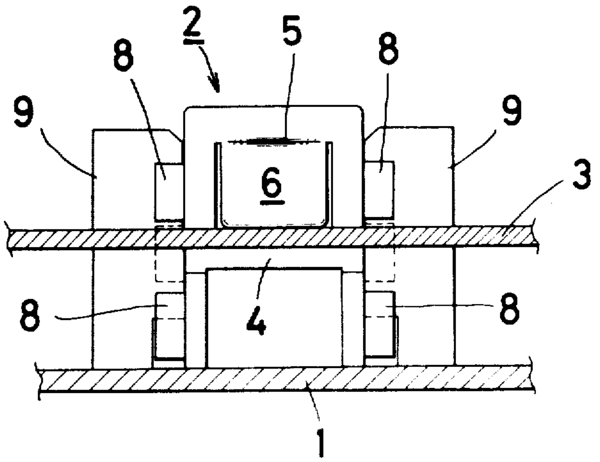
FIG. 3 is a front view of the holder, showing the holder in use.

Referring to the drawings, 1 is a base board which is fixed in the electric system of an automobile, 2 is a synthetic resin block unit which is fixed to the base board and is adapted to catch and hold a wiring plate 3 above the base board.

A block unit 2 is made of a synthetic resin of a proper hardness and resilience. The front of the block has a support projection 4 and a catch projection 6. The catch projection is shaped in the form of a ramp, and the thin end 5 of the ramp catch is integrally connected to the main body of the unit. The back of the main body of the unit has a recess 7 to accommodate the ramp catch when pushed and yieldingly sunk. The thick end of the ramp catch is just above the support projection, leaving therebetween a space to accommodate the edge thickness of the wiring plate as mentioned later in detail. In use, the catch projection is pushed and yieldingly retires into the recess, thus allowing the invasion of the wiring plate.

As best shown in FIG. 1, the opposite sides of the main block body has a few staggered projections 8 and 8′ at different levels. The block unit is inserted and held in the space between two opposite plates 9, 9 rising from the base board 1, with the staggered projections catching and gripping the edge thickness of the rising plates.

As shown in FIG. 1, the base board 1 is punched and partially made open by raising square tabs 9. They are spaced from each other so as to leave a space to accommodate the block unit. Once inserted into the space between the opposite rising tabs, the staggered projections 8 and 8′ rising from the sides of the block main body catch the rising tab, thus positively preventing the block unit from moving forward and backward. The rising tabs, in turn, prevent the block unit from moving sidewise. In this particular embodiment, each rising tab has a notched portion 9′. With this arrangement, when the block unit is inserted all the way between the rising tabs, the step portion of the lowest projection snaps in and engages with the notched portion of the rising tab, thus positively preventing the block unit from being pulled out.

As is readily understood from the above, one push-and-fit operation assures the positive and reliable mounting of the block unit to the base board, with upper side projections gripping the rising tabs and lower side projection fitting in the notched portion of the associated rising tab.

In use, that is, in mounting a wiring plate 3 to a base board 1, first, block units as required are fitted in between associated rising tabs of the base board, and then the periphery of the wiring plate is pushed against the surface of the ramp catch 6, causing the ramp catch to yieldingly retire into the recess 7. The wiring plate 3 is continuously pushed until it reaches the upper surface of the support projection, and then the ramp catch snaps back to its initial state, and the wiring plate is caught in the space between the upper surface of the support and the rising end of the ramp catch. In removing the wiring plate 3, the ramp catch is pushed with finger and yieldingly sunk, thus allowing a person to remove the wiring plate from the base board.

As is readily understood from the above, advantageously the wiring plate is easily removed, for instance for repair or change, from the base board without removing the block units. Still advantageously, the back of the base board has nothing projecting therefrom when the wiring plate is attached to the base board, and therefore the base board can be put on other plates or any flat surface.

What is claimed is:

1. A synthetic resin device for removably holding a plate such as a printed circuit board comprising: a main block body having a front, a back and two opposite sides; a support projection integrally connected to the lower part of the front of said main block body; a ramp catch the thin end of which is integrally connected to the upper part of the front of said main block and the thick end of said ramp catch is above said support projection, leaving therebetween a space as large as the thickness of said plate; and two or more staggered projections rising from each of the two opposite sides of said main block body and spaced apart from each other by a distance equal to the thickness of associated rising tab plates, the back of said main block body having a recess to accommodate said ramp catch when it is pushed and yieldingly sunk.

2. A device according to claim 1 wherein the side of said main block body has three projections, and the lowest projection has a step to fit in and engage with a corresponding notched portion of the associated rising tab.

* * * * *